United States Patent [19]

Wright et al.

[11] Patent Number: 5,488,298

[45] Date of Patent: Jan. 30, 1996

[54] APPARATUS AND METHOD FOR DECREASING MAGNETIC FIELD SENSITIVITY OF LONG RF PULSES

[75] Inventors: Graham Wright, Toronto, Canada; John M. Pauly, San Francisco, Calif.

[73] Assignee: Board of Trustees of the Leland Stanford University, Stanford, Calif.

[21] Appl. No.: 351,572

[22] Filed: Dec. 6, 1994

Related U.S. Application Data

[63] Continuation of Ser. No. 101,148, Aug. 2, 1993, abandoned.

[51] Int. Cl.$^6$ .................................................. G01R 33/48
[52] U.S. Cl. ........................................ 324/309; 324/307
[58] Field of Search .................................. 324/307, 309, 324/300, 313, 314; 128/653.2

[56] References Cited

U.S. PATENT DOCUMENTS

| | | | |
|---|---|---|---|
| 4,454,474 | 6/1984 | Young | 324/309 |
| 4,733,185 | 3/1988 | Bottomley | 324/307 |
| 4,851,778 | 7/1989 | Kaufman et al. | 324/309 |
| 4,959,611 | 9/1990 | Brouost et al. | 324/309 |
| 4,983,920 | 1/1991 | Lampman et al. | 324/309 |
| 5,105,152 | 4/1992 | Pauly | 324/309 |
| 5,189,371 | 2/1993 | Conolly et al. | 324/309 |
| 5,202,631 | 4/1993 | Harms et al. | 324/309 |
| 5,233,301 | 8/1993 | Meyer et al. | 324/309 |
| 5,262,724 | 11/1993 | Tanttu | 324/309 |
| 5,281,917 | 1/1994 | Santyr | 324/309 |
| 5,341,098 | 8/1994 | Hennig | 324/309 |
| 5,349,294 | 9/1994 | Kasuboski | 324/309 |

OTHER PUBLICATIONS

Williams et al., "A Chemical Shift Insensitive Slice Selective RF Pulse (Chiss)", J. of Magn. Res. 91, pp. 57–64 (1991).

Hardy et al., "Broadband Nuclear Magnetic Resonance Pulses with Two–Dimensional Spatial Selectivity", J. Appl. Phys. 66(4), 15 Aug. 1989, pp. 1513–1516.

Hu et al., "Slew Rate Reduction in 2D Pulse Design With Nonuniform K–Space Sampling", Franciscan B Papers 149–156, Pulse Sequence I, p. 52.

Buonocore, "A Shinnar–LeRoux Algorithm for Design of 2D and 3D Spatially Selective RF Pulses", source unknown.

Levitt et al., "Compensation for Pulse Imperfections in NMR Spin–Echo Experiments", Journal of Magnetic Resonance 43, 65–80 (1981).

Hennig et al., "RARE Imaging: A Fast Imaging Method for Clinical MR", Magnetic Resonance in Medicine 3, 823–833 (1986).

Wright et al., "Decreasing B0 Sensitivity of Long RF Pulses", Twelfth Annual Scientific Meeting of the Society of Magnetic Resonance in Medicine, 1993 Abstract Form, Aug. 14–20, 1993.

*Primary Examiner*—Walter E. Snow
*Assistant Examiner*—Raymond Y. Mah
*Attorney, Agent, or Firm*—Townsend and Townsend and Crew

[57] ABSTRACT

A long RF pulse is segmented into a plurality of RF pulses segments with nuclei spin refocusing pulses provided after each RF pulse segment to maintain phase coherence off resonance and decrease nuclei spin sensitivity to magnetic field inhomogeneity. The refocusing pulses are preferably 180° rectangular pulses. Magnetic gradient segments associated with the RF pulse segments have supplemental gradients at the beginning and at the end of the gradient segment to ensure that the position in k-space for the segment corresponds to the k-space position of the gradient waveform before division into segments.

29 Claims, 4 Drawing Sheets

APPARATUS AND METHOD FOR DECREASING MAGNETIC FIELD SENSITIVITY OF LONG RF PULSES

This is a Continuation of U.S. patent application Ser. No. 08/101,148, filed Aug. 2, 1993, now abandoned.

BACKGROUND OF THE INVENTION

This invention relates generally to magnetic resonance imaging (MRI) and, more particularly the invention relates to decreasing magnetic field sensitivity of long RF excitation pulses.

Nuclear magnetic resonance (NMR) imaging, also called magnetic resonance imaging (MRI), is a non-destructive method for the analysis of materials and represents a new approach to medical imaging. It is completely non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

Briefly, a strong static magnetic field is employed to line up atoms whose nuclei have an odd number of protons and/or neutrons, that is, have spin angular momentum and a magnetic dipole moment. A second RF magnetic field, applied as a single pulse transverse to the first, is then used to pump energy into these nuclei, flipping them over, for example to 90° or 180°. After excitation the nuclei gradually return to alignment with the static field and give up the energy in the form of weak but detectable free induction decay (FID). These FID signals are used by a computer to produce images.

The excitation frequency, and the FID frequency, is defined by the Larmor relationship which states that the angular frequency $\omega_0$, of the precession of the nuclei is the product of the magnetic field $B_0$, and the so-called magnetogyric ratio, $\gamma$, a fundamental physical constant for each nuclear species:

$$\omega_0 = B_0 \cdot \gamma$$

Accordingly, by superimposing a linear gradient field, $B_z = Z \cdot G_z$, on the static uniform field, $B_0$, which defined Z axis, for example, nuclei in a selected X-Y plane can be excited by proper choice of the frequency spectrum of the transverse excitation field applied along the X or Y axis. Similarly, a gradient field can be applied in the X-Y plane during detection of the FID signals to spatially localize the FID signals in the plane. The angle of nuclei spin flip in response to an RF pulse excitation proportional to the integral of the pulse over time.

Multi-dimensional RF pulses are finding a growing range of applications in MRI. As performance demands increase (either toward smaller volumes or sharper profiles), hardware limitations on peak RF, gradient slew rates, and/or gradient amplitudes necessitate the use of longer pulse durations. However, this makes the pulses more sensitive to off-resonance effects. Various strategies have been employed to minimize pulse times and hence $B_0$ sensitivity. Designing the gradients to the hardware limits or non-uniformly sampling excitation k-space are two examples.

The present invention is directed to an improved method and apparatus for decreasing magnetic field ($B_0$) sensitivity.

SUMMARY OF THE INVENTION

In accordance with the present invention, the RF pulse is split into a plurality of segments. Refocusing pulses are then included between (before and/or after) segments to maintain phase coherence off resonance. The refocusing pulse is a pulse that reverses the process of phase dispersion among magnetic moments.

The segments can be of different lengths and numbers, however in preferred embodiments the segments are of equal length with an even number of refocusing pulses. The refocusing pulses are preferably played in quadrature to the original pulse in order to provide robustness in the presence of magnetic field errors. Further, the signs of the refocusing pulses are preferably alternated, for example "++−−" as per the MLEV pattern and "+−+−." Shorter, 180° refocusing pulses are preferred.

In preferred embodiments, after each refocusing pulse the signs of the RF segment of the original pulse and any associated gradients are reversed relative to that of the segment preceding the refocusing pulse. The sign of the RF segment is only reversed if the refocusing pulses are in quadrature to the original pulse. For gradient segments associated with the original pulse, extra gradients are added at the beginning and end of the segment to ensure that the gradient segment begins at the position in k-space corresponding to the same position in the gradient waveform before division in to segments. The end of the augmented gradient segment should be at the center of k-space (zero area under the gradient).

The invention and objects and features thereof will be more readily apparent from the following description and appended claims when taken with the drawings.

DETAILED DESCRIPTION OF ILLUSTRATIVE EMBODIMENTS

Figure 1A:
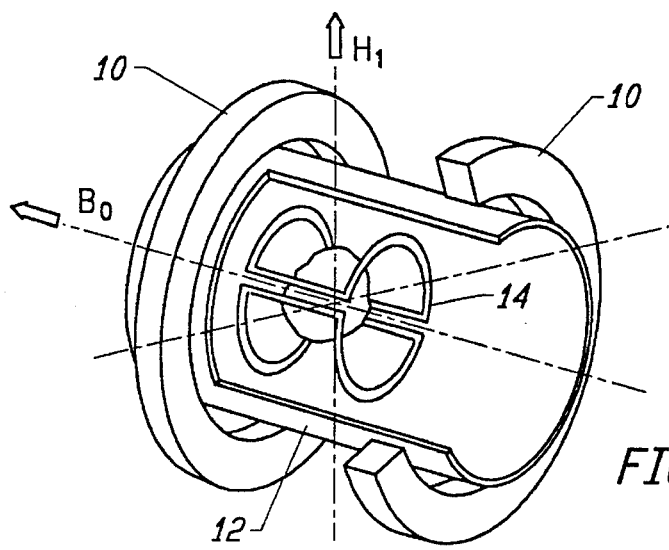
FIGS. 1A–1D illustrate the arrangement of MRI apparatus and magnetic fields generated therein.
Figure 1B:
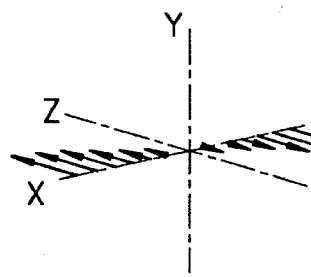
Figure 1C:
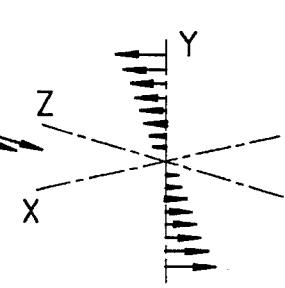
Figure 1D:
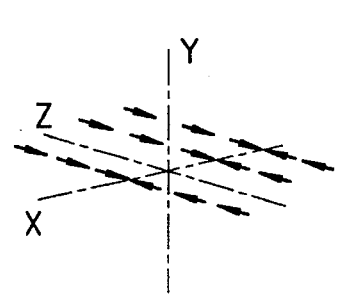

Referring now to the drawing, FIG. 1A is a perspective view partially in section illustrating coil apparatus in NMR imaging system, and FIGS. 1B–1D illustrate field gradients which can be produced in the apparatus of FIG. 1A. This apparatus is discussed by Hinshaw and Lent, "An Introduction to NMR Imaging: From the Bloch Equation to the Imaging Equation," Proceedings of the IEEE, Vol. 71, No. 3, March 1983, pp. 338–350. Briefly, the uniform static field $B_0$ is generated by the magnet comprising the coil pair 10. A gradient field G(x) is generated by a complex gradient coil set which can be wound on the cylinder 12. An RF field $B_1$ is generated by a saddle coil 14. An patient undergoing imaging would be positioned along the Z axis within the saddle coil.

In FIG. 1B an X gradient field is shown which is parallel to the static field $B_0$ and varies linearly with distance along the X axis but does not vary with distance along the Y or Z axes. FIGS. 1C and 1D are similar representations of the Y gradient and Z gradient fields, respectively.

Figure 2:
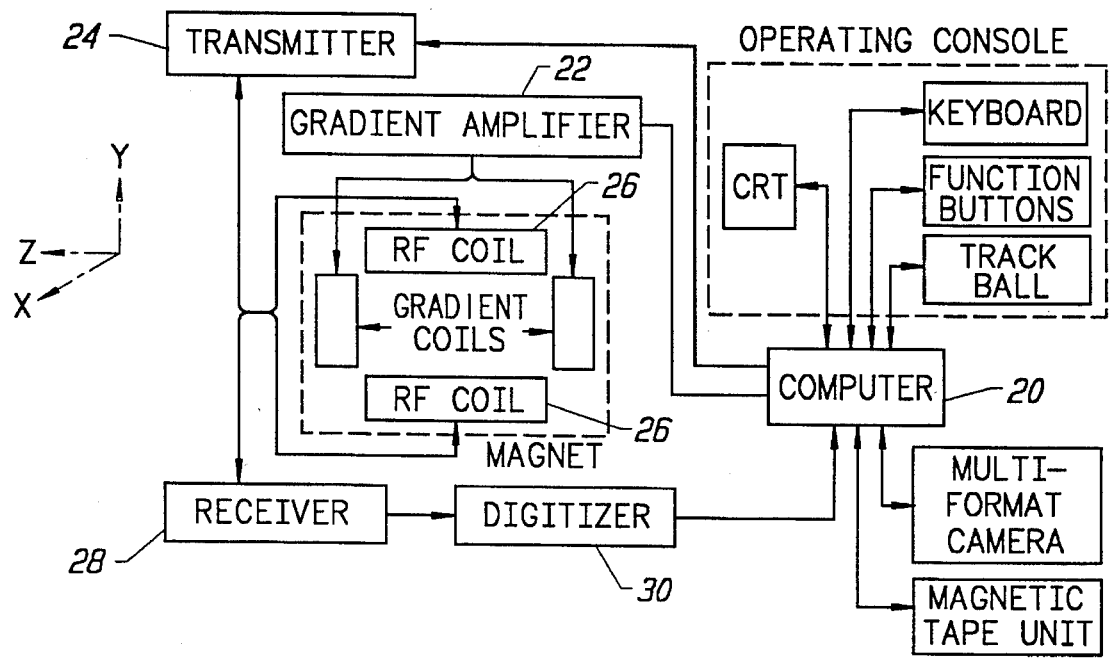
FIG. 2 is a functional clock diagram of MR imaging apparatus.

FIG. 2 is a functional block diagram of the imaging apparatus as disclosed in NMR—A Perspective on Imaging. General Electric Company, 1982. A computer 20 is programmed to control the operation of the NMR apparatus and process FID signals detected therefrom. The gradient field is energized by a gradient amplifier 22 and the RF coils for impressing an RF magnetic moment at the Larmor frequency is controlled by the transmitter 24 and the RF coils 26. After the selected nuclei have been flipped, the RF coils 26 are employed to detect the FID signal which is passed to the receiver 28 and thence through digitizer 30 for processing by computer 20.

Figure 3:
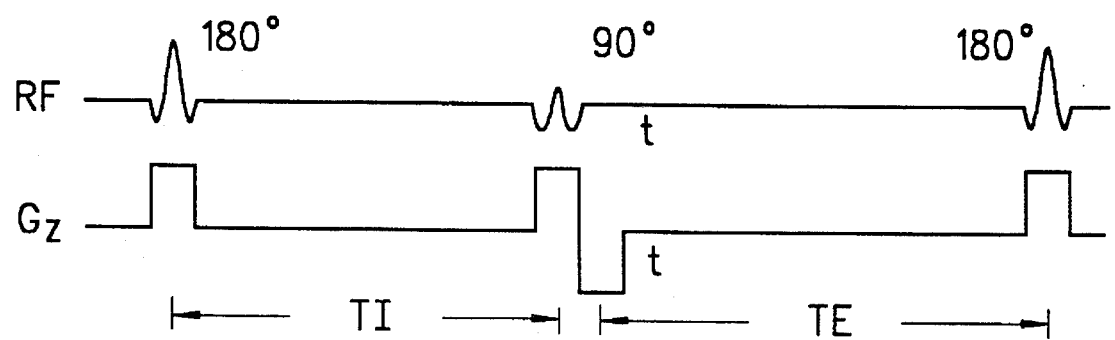
FIG. 3 illustrates a basic pulse sequence for exciting a slab for projection image.

FIG. 3 is a graph illustrating applied RF pulses for a 180° flip angle and a 90° flip angle followed by a "time reversal" 180° pulse and the associated Z axis magnetic field gradient applied during application of the RF pulses. The illustrated pulses are conventional sinc pulses which have front and back lobes with a main RF pulse therebetween.

In accordance with the present invention, sensitivity to magnetic field inhomogeneity in long RF excitation pulses is reduced by segmenting an RF pulse into a plurality of segments and providing refocusing pulses after each segment to maintain coherence off resonance.

The invention has been successfully demonstrated on a 2D inversion pulse; however the invention is applicable to any long RF pulse including long-T2 suppression pulses.

Figure 4:
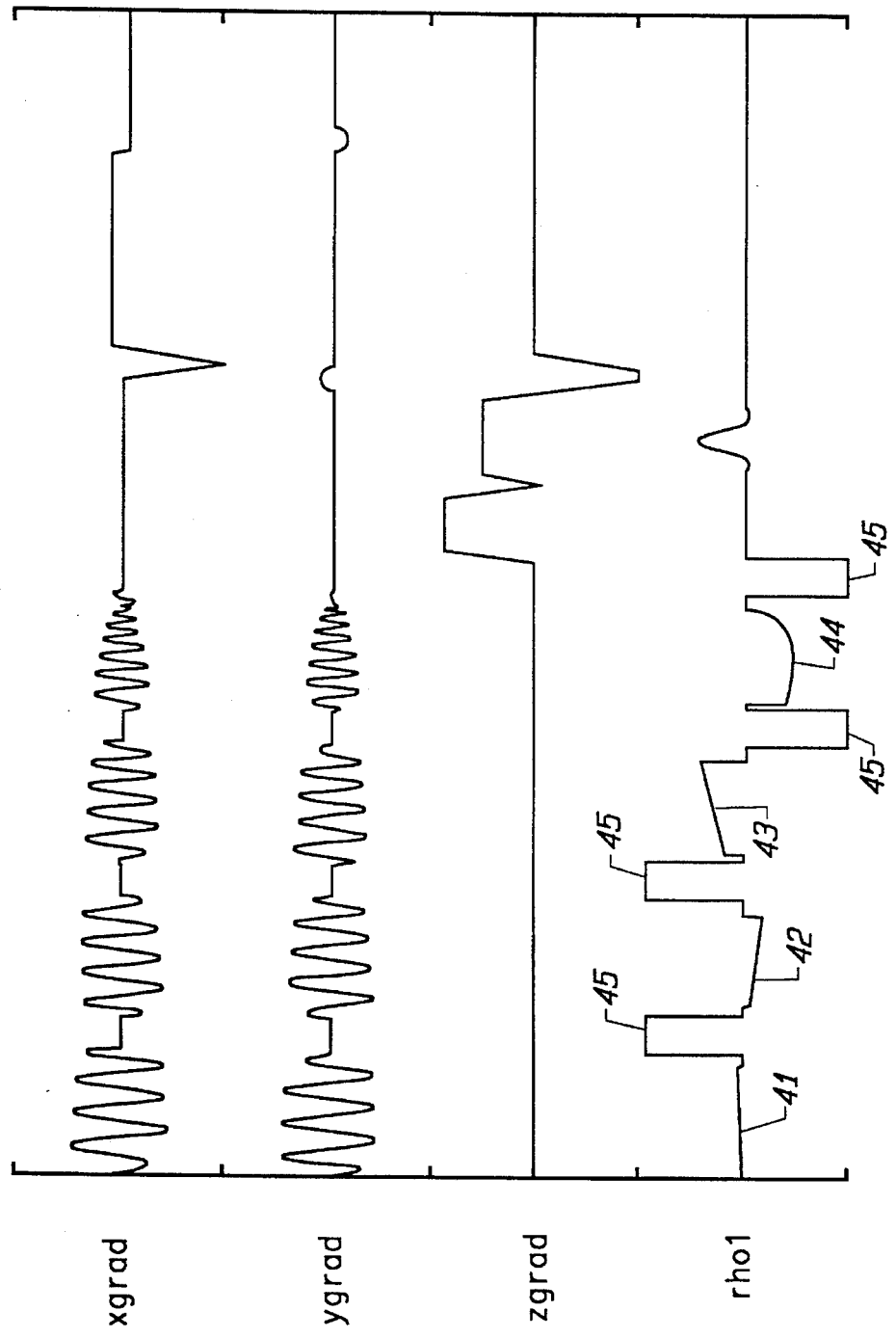
FIG. 4 illustrates an RF excitation associated gradients, and refocusing pulses between and after pulse segments in accordance with one embodiment of the invention.

Referring to FIG. 4, in one embodiment the starting pulse is a 16-ms cylindrical inversion pulse that is gradient slew-rate limited across its duration. The RF (rho 1) is a gaussian-weighted single-lobe sinc pulse yielding a roughly gaussian-shaped profile. On a G.E. 1.5 T Signa, this pulse can invert a cylinder 2 cm in diameter. However, due to its duration, its profile is severely degraded 50 Hz off-resonance. To improve this situation, the pulse is divided into 4 equal spaced apart segments 41, 42, 43, 44. For each associated gradient segment (Kgrad, Vgrad), waveforms are added to go from the center of k-space to the k-space position of the beginning of that segment. A similar waveform is added after the segment to return k-space position to the origin. This ensures that, during the refocusing pulses, there is no spatially varying phase other than that due to off-resonance. After each modified RF segment we play a rectangular π refocusing pulse 45, in quadrature to the 2D pulse. The signs of the resulting 4π pulses are alternated in the pattern ++—— to minimize sensitivity to $B_0$ and $B_1$ inhomogeneities. To account for the effects of the refocusing pulses on the trajectory of the 2D pulse, the amplitudes of the gradients and the RF are inverted after each refocusing pulse. Although the resulting pulse is 24 ms long, phase accrues over only 6 ms, the time between refocusing pulses.

The performance of the modified pulse has been checked both with simulation and through experiments. In the experiment, we cycle between two sequences where the segments associated with the original pulse are turned on and off. In each case, a slice-selective π/2 pulse perpendicular to the cylinder probes $M_z$ prepared by the inversion pulse; the resulting signal is acquired in a 2DFT format (FIG. 4). The difference signal is the profile of the inversion pulse. Cycling also eliminates spurious signals generated by the refocusing pluses. All experiments were performed on a 1.5T GE Signa with shielded gradients (slew rate=2 G/cm/ms, maximum amplitude=1 G/cm).

Figure 5:
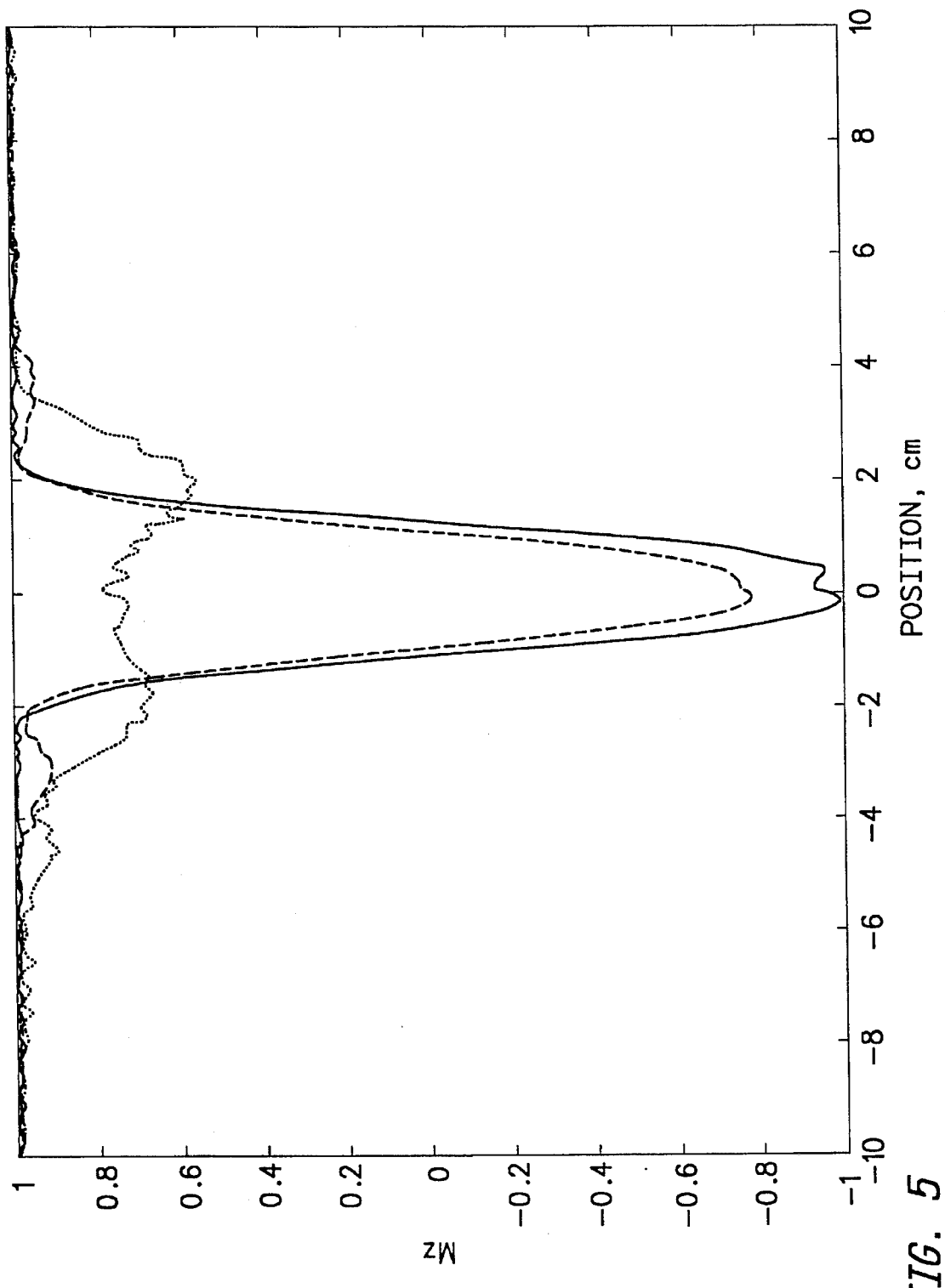
FIG. 5 illustrates pulse profiles with and without refocusing pulses.

FIG. 5 depicts the experimentally measured $M_z$ profile across the cylinder for the pulse on and off resonance as well as the off resonance behavior without the inclusion of refocusing pulses. These profiles follow closely those derived by simulation. Clearly, performance is substantially improved. The trade-off for this improvement is that the overall duration of the pulse is 50% longer in this case. Furthermore, spins outside the volume of interest experience greater total nutation and will experience a small amount of T1 and T2 decay (on the order of 1%). Some spurious signal is also possible from the refocusing pulses although this can be removed with strategies cycling the excitation as described above.

The resulting improvement in off-resonance performance makes consideration of longer RF pulses feasible. With this added degree of freedom, one can generate cylindrical pulses of smaller diameter and/or sharper edges. Some 3D pulses, as well as T2-suppression pulses designed to pass higher T2 values, are also more practical with the approach described here.

While the invention has been described with respect to a specific embodiment, the description is illustrative of the invention and is not to be construed as limiting the invention. Various modifications and applications might occur to those skilled in the art without departing from the true spirit and scope of the invention as defined by the appended claims.

What is claimed is:

1. In a method of multidimensional magnet resonance signal detection, the combination of steps including
   a) placing an object in an inhomogeneous magnetic field, and
   b) perturbing nuclei in said object with a multidimensional RF pulse, said RF pulse including a plurality of spaced apart RF signal segments with a plurality of refocusing pulses associated with segments for refocusing spins including a refocusing pulse between each adjacent pair of spaced apart segments.

2. The combination of steps as defined by claim 1 wherein said refocusing pulses, played in the absence of associated RF segments, leave nuclei magnetization substantially unperturbed.

3. The combination of steps as defined by claim 2 wherein the number of refocusing pulses is an even number.

4. The combination of steps as defined by claim 3 wherein said refocusing pulses are in phase quadrature to said RF pulse segments.

5. The combination of steps as defined by claim 4 wherein said signal segments are of equal length.

6. The combination of steps as defined by claim 1 wherein signs of said refocusing pulses are alternated.

7. The combination of steps as defined by claim 6 wherein said refocusing pulses are each approximately 180° pulses.

8. The combination of steps as defined by claim 7 wherein each of said refocusing pulses is a rectangular pulse.

9. The combination of steps as defined by claim 8 wherein said refocusing pulses are each approximately 180° pulses.

10. The combination of steps as defined by claim 9 wherein each of said refocusing pulses is a rectangular pulse.

11. The combination of steps as defined by claim 1 and further including the step of applying magnetic gradient segments to said object during application of said RF signal segments.

12. The combination of steps as defined by claim 11 wherein the signs of an RF signal segment and a magnetic gradient applied therewith are reversed relative to a sign of a preceding RF sign segment and magnetic gradient.

13. The combination of steps as defined by claim 12 and further including supplemental gradients at a beginning and at an end of each RF signal segment to provide a position in k-space for each magnetic segment gradient corresponding to a position for a magnetic gradient undivided into segments.

14. The combination of steps as defined by claim 13 and further including the steps of c) detecting magnetic resonance signals from said nuclei, and
   d) imaging said magnetic resonance signals.

15. The combination of steps as defined by claim 1 and further including the steps of c) detecting magnetic resonance signals from said nuclei, and
   d) imaging said magnetic resonance signals.

16. In apparatus for multidimensional magnetic resonance signal detection, the combination comprising a) means for directing a magnetic field through an object, and
   b) means for perturbing nuclei in said object with a multidimensional RF pulse, said RF pulse including a plurality of spaced apart RF signal segments with a plurality of refocusing pulses associated with segments for refocusing spins including a refocusing pulse between each adjacent pair of spaced apart segments.

17. The combination as defined by claim 16 and further including c) means for detecting magnetic resonance signals from said nuclei.

18. The combination as defined by claim 17 wherein the number of refocusing pulses is an even number.

19. The combination as defined by claim 17 wherein said refocusing pulses are in phase quadrature to said RF excitation pulse.

20. The combination as defined by claim 19 wherein said signal segments are of equal length.

21. The combination as defined by claim 19 wherein signs of said refocusing pulses are alternated.

22. The combination as defined by claim 21 wherein said refocusing pulses are each approximately 180° pulses.

23. The combination as defined by claim 22 wherein each of said refocusing pulses is a rectangular pulse.

24. The combination as defined by claim 16 and further including means for applying magnetic gradient segments to said object during application of said RF signal segments.

25. The combination as defined by claim 24 wherein the signs of an RF signal segment and a magnetic gradient applied therewith are reversed relative to a sign of a preceding RF sign segment and magnetic gradient.

26. The combination as defined by claim 25 and further including means for applying supplemental gradients at a beginning and at an end of each RF signal segment to provide a position in k-space for each magnetic segment gradient corresponding to a position for a magnetic gradient undivided into segments.

27. The combination as defined by claim 26 and further including c) means for detecting magnetic resonance signals from said nuclei.

28. The combination as defined by claim 27 wherein said refocusing pulses, played in the absence of associated RF segments, have nuclei magnetization substantially unperturbed.

29. The combination as defined by claim 16 wherein said refocusing pulses, played in the absence of associated RF segments, have nuclei magnetization substantially unperturbed.

* * * * *